United States Patent

Fujimoto

[15] 3,665,265

[45] May 23, 1972

[54] MOS INTEGRATED CIRCUIT SEMICONDUCTOR DEVICE

[72] Inventor: Syoji Fujimoto, Tokyo, Japan

[73] Assignee: Nippon Electric Company, Limited, Tokyo, Japan

[22] Filed: Oct. 27, 1970

[21] Appl. No.: 84,332

[30] Foreign Application Priority Data

Oct. 29, 1969 Japan....................................44/86216

[52] U.S. Cl......................317/235 R, 317/235 B, 317/235 G, 317/235 AG, 317/234 N

[51] Int. Cl. ....................................................................H01l

[58] Field of Search.............317/235 B, 235 G, 235, 235 AG

[56] References Cited

UNITED STATES PATENTS 3,550,256 12/1970 Deal ........................................29/571

3,502,950 3/1970 Nigh ......................................317/235

OTHER PUBLICATIONS

Burkhardt; I.B.M. Technical Disclosure Bulletin, Vol. 10, No. 2, July 1967, page 160

Gregor; I.B.M. Technical Disclosure Bulletin, Vol. 11, No. 2, July 1968, pp. 118–119

*Primary Examiner*—John W. Huckert

*Assistant Examiner*—Martin H. Edlow

*Attorney*—Hopgood & Calimafde

[57] ABSTRACT

An MOS integrated circuit having a duplex insulating material structure wherein an aluminum oxide layer is disposed over the silicon oxide layer. Gate insulating material is protected against contamination from organic solvent and photoresist. In an n-channel device, the threshold voltage of the thick insulating material is increased to thereby reduce the likelihood of parasitic or leakage conduction between adjacent MOS transistors in the circuit.

2 Claims, 6 Drawing Figures

Patented May 23, 1972 3,665,265

2 Sheets-Sheet 1

Figure 1A:
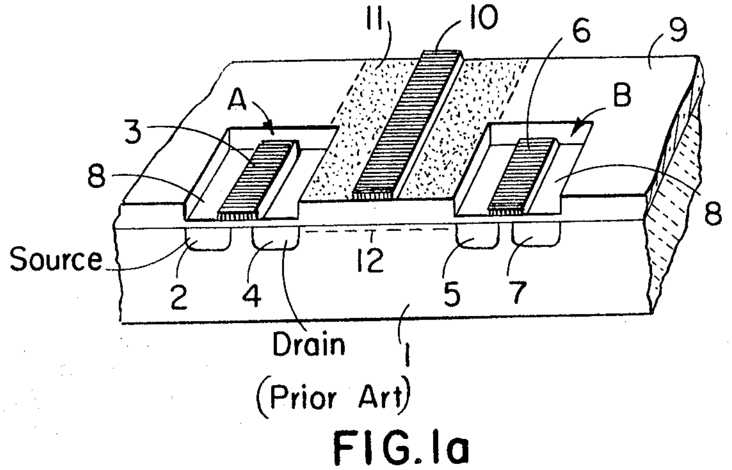

INVENTOR
Syuji Fujimoto by

Sandoe, Hopgood & Calimafde
ATTORNEYS

Patented May 23, 1972 3,665,265

2 Sheets-Sheet 2

INVENTOR
Syuji Fujimoto by Sandoe, Hopgood & Calimafde
ATTORNEYS

MOS INTEGRATED CIRCUIT SEMICONDUCTOR DEVICE

This invention relates to MOS integrated circuits.

An MOS integrated circuit is fabricated by forming desired circuit elements, such as MOS transistors, tunnel resistors, and the like within a semiconductor substrate and forming interconnections between these circuit elements by metal interconnection selectively formed over the substrate.

In the forming of the metal interconnection, a thin metallic film is produced on the surface of an insulating material (oxide layer), which covers the semiconductor substrate by a method such as evaporation, after opening contact holes at desired locations of the insulating material. Thereafter, regions of the metallic thin film that are not to be utilized in the completed circuit are eliminated by photo etching so that only the necessary interconnection portions remain on the oxide layer. Aluminum is usually employed as the metal for the interconnection since it is amenable to evaporation and photo etching operations.

A metal interconnection method of this type, however, has many disadvantages. For example, the gate insulating material, which is the most sensitive region to contamination is exposed to ambient except for those portions that are covered by the metal gate electrode so that the gate insulating material is easily contaminated.

In the conventional fabrication method employing an etching process of aluminum in which a photo resist is used as a mask, it is required to chemically eliminate the photo sensitive solvent or photo resist after etching. In the subsequent cleaning process, acid cannot be used because of the presence of aluminum, so that an organic solvent must be used as the cleaner.

Generally, since the photo-sensitive solvent, the remover for the photo sensitive solvent, and the organic solvent, comprise many kinds of impurities, they work as the main impurity source in the known fabricating process of the MOS semiconductor device. As described above, in the usual process, since the cleaning process employing the organic solvent is performed at the final stage of fabrication, and the protection of the gate insulating material is not sufficient, there is a resultant adverse effect to the properties of the semiconductor devices fabricated by this process, and, in particular, to the threshold voltages of the MOS transistors.

Moreover, in the conventional MOS integrated circuit, the surface of the insulating material protecting the substrate surface is easily charged up and this electric charge produces the so-called parasitic channel which may cause circuit failure. One reason for the formation of the parasitic channel is that the metal interconnection is exposed on the insulating material so that an electric charge is supplied on the insulating material as a result of a voltage applied to the metal interconnections. Another reason is that the threshold voltage limited by the insulating material protecting substrate surface is not sufficiently high.

The gate voltage required to produce channel inversion in an MOS transistor is called the threshold voltage $V_T$, which is expressed by the following equation:

$$V_T=\frac{T_i}{\epsilon i}\,(Q_{SS}+Q_B) \qquad (1)$$

where $T_i$ is the thickness of the gate insulating material; $\epsilon i$ is the dielectric constant of the gate insulating material; $Q_{SS}$ is the surface state charge density; and $Q_B$ is the value related to impurity concentration of the substrate.

As is obvious from Equation (1), $V_T$ is increased in proportion to the thickness $T_i$ of the gate insulating material. In the MOS integrated circuit, therefore, the MOS transistor has a value of $V_T$ that is determined by the thickness of the gate insulating material and, at the same time, the area of the circuit other than the gate region has a value of $V_T$ that is determined by the thickness of the thick insulating material. The value of $V_T$ that is proportional to the thickness of the gate insulating material is larger than the value of $V_T$ of the active MOS transistor. Generally, in the integrated circuit, interconnection metal is disposed on the thick insulating material. Hence, if the threshold voltage $V_T$ of the thick insulating material is lower than the voltage applied to the metal interconnection a parasitic channel is produced beneath the interconnection to permit leakage current to flow therein, and as a result of this parasitic conduction, an undesirable influence is introduced into the operation of the integrated circuit. The thickness of the thick insulating material is therefore to be determined so that its threshold voltage is higher than the power source voltage whose value is usually fairly high.

As described above, the value of $V_T$ of the thick insulating material is increased by increasing the thickness of the insulating material. However, the thickness of the insulating material cannot be increased to the desired value as a result of technical limitations. More specifically, the fabricating process of the integrated circuits usually comprises a photo etching process, and the accuracy of photo etching is reduced as the insulating material to be etched becomes thicker. However, the accuracy of photo etching must be increased as the density of integrated circuits is made greater, so that for these integrated circuits it becomes difficult to realize a thicker insulating material and to obtain a threshold voltage that is higher than the power source voltage used.

It is an object of this invention to provide an MOS integrated circuit having a structure in which the surface of the protecting insulating material is covered with an aluminum oxide layer, in which the gate insulating material is prevented from contamination by organic solvents during fabrication.

It is another object of the invention to provide an n-channel MOS integrated circuit having an increased threshold voltage of the thick insulating material and in which the likelihood of circuit failure as a result of parasitic conduction is reduced.

The surface protection layer formed by aluminum oxide is fabricated in a manner such that the aluminum layer evaporated on the surface of the insulating layer is treated by an anode oxidation process. In this process, the interconnection regions of the aluminum layer remain as aluminum, and the other regions of the aluminum layer are entirely changed to aluminum oxide. As a result, the portions uncovered by the gate metal electrode in the silicon oxide thin film are also entirely covered by aluminum oxide.

Therefore, since in the subsequent processes for removing the photo-sensitive solvent and for cleaning by the organic solvent, the aluminum oxide surface is cleaned, the silicon oxide covering substrate surface, and particularly the gate insulating material, are not directly tainted by the organic solvent.

Moreover, in the case of an n-channel transistor, this invention is effective to prevent leakage current due to parasitic channel.

It is known that in the silicon oxide layer there is a positive charge attributable to an impurity such as a metal ion. This electric charge is expressed as $Q_{SS}$ in Equation (1). However, in the state immediately before the channel is formed, there is in the vicinity of the p-type silicon substrate surface no hole but a region filled with a negative charge due to the ionized p-type impurity. This region is usually called the "depletion layer." The negative charge in this region is expressed as $Q_B$ in Equation (1). The threshold voltage $V_T$ is proportional to the thickness $T$, based on $Q_{SS} + Q_B$ as the proportional constant. In the n-type MOS transistor, $Q_{SS}$ is positive and $Q_B$ is negative, as described above. In other words, $Q_{SS}$ and $Q_B$ have mutually reverse signs. In order to make $Q_{SS}$ smaller than $Q_B$, cleanliness must be carefully maintained and metal ions which serve as the positive charge must not be introduced into the insulating material during production. By best doing this, however, $Q_{SS}$ is made a little smaller than $Q_B$. Hence, in Equation (1), the proportional constant $Q_{SS} + Q_B$ is normally a very small negative value, so that a sufficiently high value of $V_T$ cannot be obtained even if the thickness of the insulating material is increased. To obtain a large value of $Q_{SS} + Q_B$, it is necessary to decrease $Q_{SS}$, which represents the positive charge, or increase $Q_B$, which represents the negative charge.

By thus increasing the value of $Q_{SS}+Q_B$, a higher value of $V_T$ of the thick insulating material can be expected.

It is well known that aluminum oxide itself has a negative charge. Therefore, when an aluminum oxide layer is disposed on the silicon oxide layer, as proposed by this invention, and the resultant insulating material of a duplex structure is used, then the value of $Q_B$, which represents the negative charge, can be substantially increased. As a result, the proportional constant $Q_{SS}+Q_B$, and thus the value of the threshold voltage, is increased.

According to the invention, the thickness of the insulating material can be increased by using insulating material of a duplex structure consisting of silicon oxide and aluminum oxide, and thus the value of $V_T$ can be made sufficiently higher than the expected maximum voltage used.

Figure 1B:
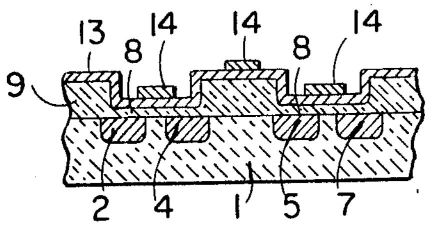
Figure 1C:
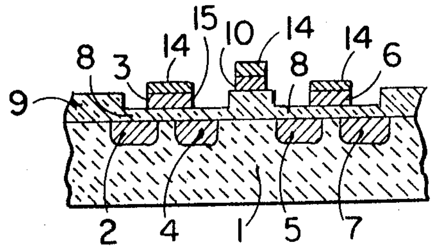

To the accomplishment of the above and to such further objects as may hereinafter appear, the present invention relates to an MOS integrated circuit semiconductor device, substantially as defined in the appended claims and as described in the following specification taken together with the accompanying drawings in which:

FIG. 1*a* is a perspective sectional schematic diagram of a conventional MOS integrated circuit;

FIGS. 1*b* and 1*c* are cross-sectional views illustrating steps in the conventional process for forming the gate electrode and interconnection of the circuit of FIG. 1*a;*

Figure 2:
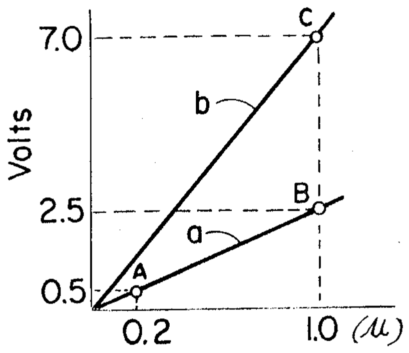
Figure 3:
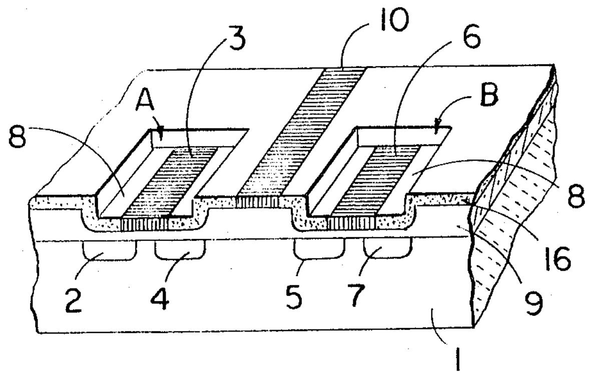
Figure 4:
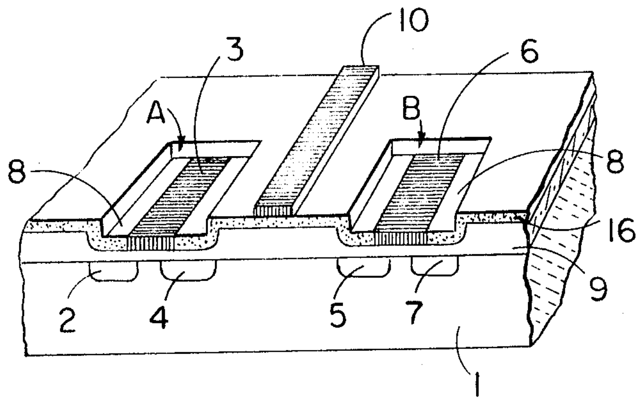

FIG. 2 is a graphic presentation illustrating the principles of this invention; and FIGS. 3 and 4 are sectional schematic diagrams showing MOS integrated circuit semiconductor devices embodying this invention.

The invention will be more specifically explained by referring first to FIG. 1*a* which schematically illustrates a part of a conventional n-channel MOS integrated circuit. This integrated circuit has two MOS field effect transistors formed in a p-type semiconductor substrate 1, and a metal interconnection is disposed between the two transistors. The left transistor is generally designated A and the right transistor is designated B. Transistor A comprises a source 2, a gate electrode 3, and a drain 4, and transistor B comprises a source 5, a gate electrode 6, and a drain 7. The thickness of the gate insulating material 8 of the MOS transistors is normally determined to be 1,000 to 2000 A. so as to maintain the characteristics required for an MOS transistor. This insulating material coating is commonly a silicon oxide film formed through a thermal oxidation process. The area on the surface of the semiconductor substrate, except for the regions of the MOS transistors, is covered with a thick insulating material 9, and a metal wiring 10, which is a compositional element of the integrated circuit, is disposed on the thick insulating material.

The conventional processes for realizing the aluminum interconnection as shown in FIG. 1*a* are illustrated in FIGS. 1*b* and *c*. As therein shown, an aluminum thin film 13 is usually formed by evaporation on the entire surface of the silicon oxide layer 9, as shown in FIG. 1*b*. The surface of the aluminum layer that is to remain is then covered with a photo sensitive solvent 14 for photo etching. In this state, the aluminum film is etched, and as shown in FIG. 1*c*, the desired aluminum interconnection for defining the gate electrodes 3 and 6 and metal interconnection 10 remain. The photo-sensitive solvent 14 is then eliminated by a suitable remover and the structure shown in FIG. 1*a* is obtained after a cleaning process making use of an organic solvent.

As shown in FIG. 1*c*, according to the conventional manufacturing method, the silicon oxide film and especially the important gate insulating material 8 is protected by aluminum electrodes 3 and 6, but the boundary side area 15 of the aluminum electrode - silicon oxide interface remains exposed.

Therefore, in the process for eliminating photo-sensitive solvent 14 and the cleaning process utilizing the organic solvent, contamination of the gate insulating material 8 is often advanced along boundary side area 15, with the resulting considerable dispersion of the properties of the semiconductor device.

In the structure as shown in FIG. 1*a*, wherein a high voltage such as a power source voltage is assumed to be applied to the metal interconnection 10, when the integrated circuit is operated at a high temperature for a long period of time, the interconnection serves as a source of an electric field or charge, and a charged region 11 is thus formed on the insulating material around the interconnection. When the threshold voltage $V_T$ of the thick insulating material is lower than the voltage applied to the interconnection 10, a parasitic channel 12 is produced on the surface of the semiconductor substrate located below the charged region 11 as a result of the potential of the charged region 11. When the charged region 11 spreads across the drain 4 of transistor A and the source 5 of transistor B, as shown in FIG. 1*a*, parasitic leakage current flows between the drain 4 of transistor A and the source 5 of transistor B due to the formation of the parasitic channel 12. This leakage current, as noted above, adversely affects the operation of the integrated circuit.

As shown by Equation (1), the threshold voltage $V_T$ of an MOS transistor is proportional to the thickness T of the insulating material, and its slope is determined by the value $Q_{SS}+Q_B$. When the gate insulating material 8 and the insulating material 9 applied to an area other than the gate region are made of silicon oxide by thermal oxidation as in the structure shown in FIG. 1*a*, $Q_B$ is only a little larger than $Q_{SS}$, and the value of $Q_{SS}+Q_B$, namely the proportional constant taken in connection with the proportional relationship between $V_T$ and $Ti$ of Equation (1), is small. The straight line a in FIG. 2 is a graphical presentation of Equation (1) wherein $T$ is plotted along the abscissa and $V_T$ is plotted along the ordinate. The point A on the straight line a indicates that a threshold voltage, $V_T$, of 0.5 volt is obtained when the thickness of the gate insulating material 8 of the MOS transistor is 0.2 micron. Point B on line a indicates that a $V_T$ of 2.5 volts is obtained when the thick insulating material 9 other than the gate insulating material is 1.0 micron in thickness. When an integrated circuit is formed by using an MOS transistor whose value of $V_T$ is 0.5 volt, the power source voltage must be about 5 volts. In such case, the value of $V_T$ of the thick insulating material is low, and it is thus practically impossible to realize an integrated circuit.

FIG. 3 shows an embodiment of the invention applied to the MOS integrated circuit shown in FiG. 1*a*. In the embodiment of FIG. 3, elements of the circuit corresponding to elements in the embodiment of FIG. 1*a* are identified by similar reference numerals. In the embodiment of FIG. 3, the region of the insulating material other than the region covered by the metal interconnection is coated with an insulating material of duplex structure consisting of a silicon oxide layer 9 and an aluminum oxide layer 16. More specifically, this integrated circuit structure of FIG. 3 is formed in the following manner. First, the surface of the substrate is covered with a layer of silicon oxide, and diffusion windows are selectively opened at desired regions. The regions such as source regions 2 and 5, drain regions 4 and 6, and the tunnel interconnection region, of which the conduction type is reverse to that of the substrate used, are formed on the surface of the substrate by a conventional process such as a diffusion process. Then, silicon oxide channel regions are selectively etched and clean gate insulators are formed to the desired thickness. After contact holes are opened, the entire surface of the silicon oxide layer is covered with an aluminum film by evaporation or a similar process. A photosensitive solvent is then applied to the entire surface of the aluminum film, and, after photoprocessing, the photosensitive solvent is left on the area of the aluminum film at the desired metal interconnection region. This process may be done by a conventional photo etching technique. Thus the regions of the aluminum film that are to become the gate electrode and metal interconnection are protected by the photosensitive agent. An anode oxidation operation is then performed, not only to the area protected by the photosensitive agent, but to all the exposed aluminum area, so that the exposed area of the aluminum film is oxidized, and a structure as shown in FIG. 3, which has the duplex structure insulating material, is thus obtained.

According to this structure, the gate insulating material that requires extreme cleanliness is completely protected by aluminum gate electrodes 3 and 6 as well as by the overlying aluminum oxide layer 16. Since the removing process of the photosensitive solvent and the cleaning process utilizing the organic solvent are both performed after this structure is completed, the gate insulating material is not directly exposed to the remover of photosensitive solvent and the organic solvent, so that a higher degree of cleanliness of the gate insulating material is achieved.

Moreover, in the integrated circuit of the invention comprising an insulating material of a duplex structure consisting of an aluminum oxide layer disposed on the silicon oxide layer, the value $Q_{SS} + Q_B$, which determines the slope of the straight lines in FIG. 2, is increased, so that a steep slope line *b* in FIG. 2 is obtained for an n-channel MOS transistor fabricated according to the invention. In this case, an arbitrary value of $Q_{SS} + Q_B$, namely an arbitrary slope, can be obtained by changing the thickness of the aluminum oxide layer. On straight line *b*, a threshold voltage of 7.0 volts is obtained when the thickness of the thick insulating material is 1.0 micron. According to this invention, when silicon oxide is used for the gate insulating material, the threshold voltage of the gate insulating material is determined to the low value indicated by point *A* on line *a*, and the high threshold voltage of the thick insulating material other than the gate insulating material has a value indicated by the point *C* on line *b*.

As a result of the increased threshold voltage of the thick insulating material, no parasitic channel is formed on the substrate surface below the aluminum oxide layer 16 even if a charged region spreads over the surface of the aluminum oxide layer 16, as shown in the embodiment of FIG. 1a.

FIG. 4 illustrates another embodiment of the invention in which the insulating material having a duplex structure consisting of a silicon oxide layer and an aluminum oxide layer is used for all the insulating layers excepting for the gate insulating layers. To form the semiconductor device of FIG. 4, the silicon oxide film is covered with an aluminum thin film in the same manner as in the embodiment of FIG. 3. Selective anode oxidation using a photosensitive solvent is then applied to the aluminum film whereby all the aluminum film except for the area of the gate electrodes is oxidized. A metal thin film is then evaporated onto the entire surface of the aluminum oxide film, and all the aluminum film except for the metal interconnection area is removed by a photo etching process.

In the structure of the MOS semiconductor circuit as described above, not only is the spread of the parasitic channel due to the formation of the charged region prevented, but the production of the parasitic channel due to the interconnection itself is also prevented.

In the above-described embodiments of the invention, a photosensitive material is used for the mask in the anode oxidation process. The invention, however, is not limited to this process; for example, a photosensitive material may be used for the mask to apply thin anode oxidation to the gate electrode area and thus a non-porous aluminum oxide region is formed. The photosensitive material is then removed, and the non-porous aluminum oxide of the gate electrode area is used for the mask to apply another anode oxidation step to the areas other than the gate electrode region, and thus porous aluminum oxide regions are formed. In this way, the semiconductor structure as shown in FIGS. 3 and 4 can be realized.

Thus while only two embodiments of the present invention has been herein specifically described, it will be apparent that modifications may be made therein without departing from the spirit and the scope of the invention.

I claim:

1. A MOS integrated circuit comprising a semiconductor substrate of p type conductivity type, a plurality of conduction regions of n-type conductivity type formed on one surface of said semiconductor substrate, a silicon oxide film disposed over said substrate surface, an aluminum gate electrode disposed on said oxide film at a gate insulating region, an aluminum interconnection region for interconnecting circuit elements included in said integrated circuit formed on said oxide film, and an aluminum oxide layer formed on the entire surface of said oxide film except for the area of said gate electrode and said interconnection region and contacting said gate electrode and said interconnection region so that said oxide layer, said gate electrode, and said interconnection region establish a continuous layer covering the entire surface of said insulating film.

2. The integrated circuit of claim 1, in which said silicon oxide layer includes a reduced thickness gate insulating region.

* * * * *